United States Patent

McMahon et al.

[11] Patent Number: 5,804,771
[45] Date of Patent: Sep. 8, 1998

[54] ORGANIC SUBSTRATE (PCB) SLIP PLANE "STRESS DEFLECTOR" FOR FLIP CHIP DEIVCES

[75] Inventors: John F. McMahon, Phoenix; Ravi Mahajan, Tempe, both of Ariz.

[73] Assignee: Intel Corporation, Santa Clara, Calif.

[21] Appl. No.: 721,268

[22] Filed: Sep. 26, 1996

[51] Int. Cl.⁶ .................................................. H05K 1/03
[52] U.S. Cl. ........................................ 174/255; 361/795
[58] Field of Search ................... 174/250, 255; 361/748, 750, 795, 792; 156/289, 290; 428/901

[56] References Cited

U.S. PATENT DOCUMENTS

| | | | |
|---|---|---|---|
| 4,847,136 | 7/1989 | Lo | 428/195 |
| 5,367,435 | 11/1994 | Andros et al. | 361/749 |
| 5,386,341 | 1/1995 | Olson et al. | 361/749 |

*Primary Examiner*—Kristine L. Kincaid
*Assistant Examiner*—Kristina Soderquist
*Attorney, Agent, or Firm*—Blakely, Sokoloff, Taylor & Zafman

[57] ABSTRACT

A flip chip integrated circuit package which provides stress relief for the solder bumps of the package. The package includes an integrated circuit that is mounted to a substrate. The integrated circuit is attached to a plurality of bond pads of the substrate by a number of corresponding solder bumps. The substrate has a first layer that is attached to a second layer. An area that is located between the layers and adjacent to the bond pads is left unattached so that a portion of the first layer can move independent of the remaining portion of the substrate. The unattached area allows the integrated circuit to "float" and expand at a different rate than the substrate when the package is thermally cycled.

9 Claims, 2 Drawing Sheets

ORGANIC SUBSTRATE (PCB) SLIP PLANE "STRESS DEFLECTOR" FOR FLIP CHIP DEIVCES

BACKGROUND OF THE INVENTION

1. Field of the Invention

The present invention relates to an integrated circuit package.

2. Description of Related Art

Integrated circuits are typically assembled into a package that is mounted to a printed circuit board. In some packages the integrated circuits are wire bonded to internal bond fingers of the package. The bond fingers are routed to external contacts that are soldered to the printed circuit board. The wire bonding process creates a process step that increases the cost of producing the package. Additionally, the bond wires may create an undesirable inductance within the package.

FIG. 1 shows an integrated circuit package commonly referred to as a "flip chip" package. Flip chip packages allow an integrated circuit 1 to be directly mounted to a substrate 2 without using bond wires. The flip chip substrate 2 is typically constructed as a printed circuit board which contains internal routing layers that couple a plurality of bond pads to external contacts of the substrate 2. The integrated circuit 1 has a plurality of solder bumps 3 that are reflowed to mount the die 1 to the bond pads of the substrate 2.

The integrated circuit 1 typically has a coefficient of thermal expansion that is different than the thermal coefficient of the substrate. As shown in FIG. 2, when the package is thermally cycled the integrated circuit die 1 expands at a different rate than the substrate 2. The differential expansion creates mechanical strain and stresses on the solder bumps 3. When thermally cycled the thermally induced stress may crack the solder bumps 3 and render the package inoperative. It has been found that the solder bumps of a flip chip package may fail at unacceptably high rates when the package is thermally cycled. It would be desirable to have a flip chip package that provides stress relief for the solder bumps to increase the life of the package.

SUMMARY OF THE INVENTION

The present invention is a flip chip integrated circuit package which provides stress relief for the solder bumps of the package. The package includes an integrated circuit that is mounted to a substrate. The integrated circuit is attached to a plurality of bond pads of the substrate by a number of corresponding solder bumps. The substrate has a first layer that is attached to a second layer. An area that is located between the layers and adjacent to the bond pads is left unattached so that a portion of the first layer can move relative to the remaining portion of the substrate. The unattached area allows the integrated circuit to "float" and expand at a different rate than the substrate when the package is thermally cycled.

DETAILED DESCRIPTION OF THE INVENTION

Figure 1:
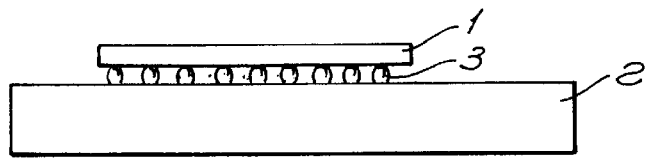
FIG. 1 is side view of an integrated circuit package of the prior art.
Figure 2:
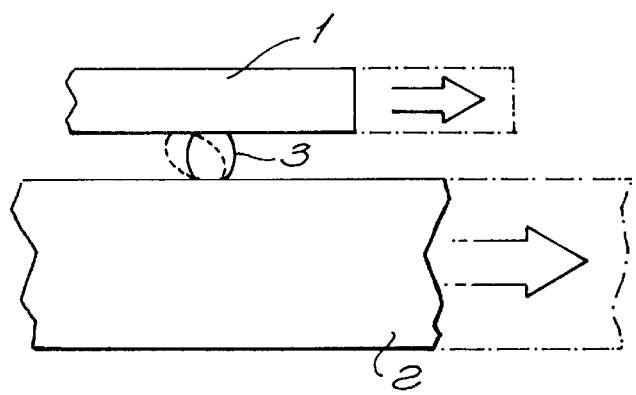
FIG. 2 is an enlarged sectional view of the package of FIG. 1 showing a thermal expansion of the package.
Figure 3:
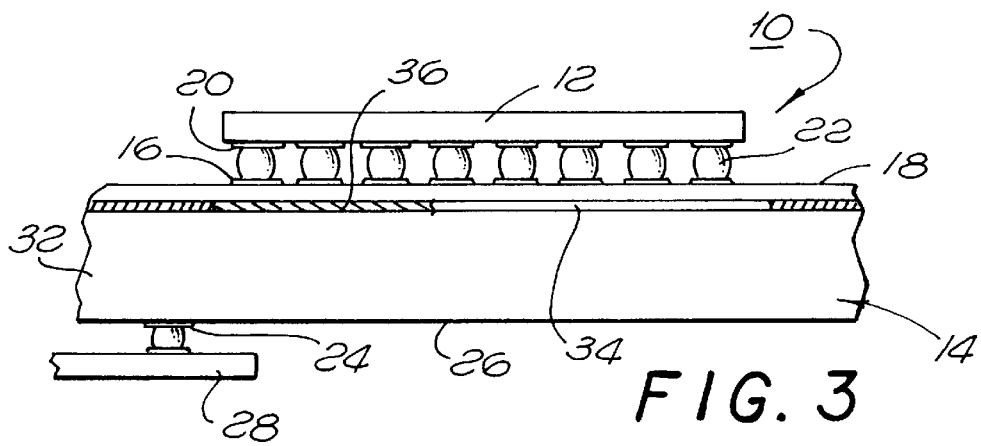
FIG. 3 is a side cross-sectional view of an integrated circuit package of the present invention.
Figure 4:
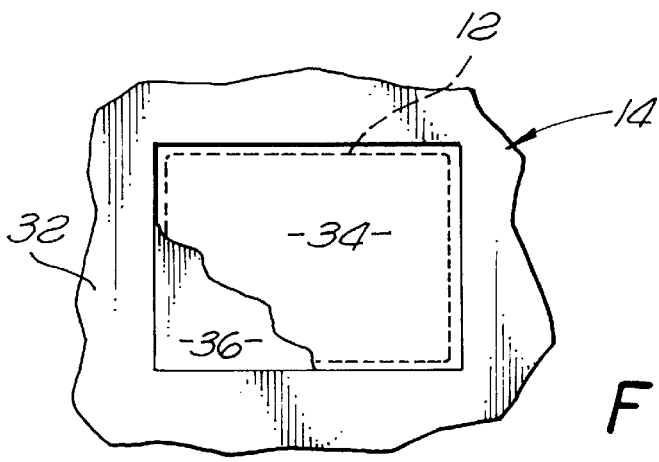
FIG. 4 is a top cross-sectional view of the integrated circuit package shown in FIG. 3.

Referring to the drawings more particularly by reference numbers, FIGS. 3 and 4 show an integrated circuit package 10 of the present invention. The package 10 includes an integrated circuit 12 that is mounted to a substrate 14. The integrated circuit 12 may be any semiconductor device such as a microprocessor. The substrate 14 is typically a printed circuit board that has a plurality of bond pads 16 located on a top surface 18. The bond pads 16 are connected to corresponding die pads 20 of the integrated circuit 12 by solder bumps 22.

The substrate 14 contains internal routing (not shown) which couples the bond pads 16 to a plurality of contacts 24 located on a bottom surface 26. The contacts 24 are typically soldered to an external printed circuit board 28. The substrate 14 electrically and mechanically couples the integrated circuit 12 to the external printed circuit board 28. Although a printed circuit board substrate 14 is shown and described, it is to be understood that the substrate 14 can be constructed with other known multi-layered substrate processes and materials.

The substrate 14 is typically constructed to have a first layer 30 and at least one second underlying layer 32. The first layer 30 may have the bond pads 16. The substrate 14 has an area 34 where the first layer 30 is not attached to the second layer 32. The unattached area 34 allows the adjacent portion of the first layer 30 to move and float relative to the underlying layer(s) 32 of the substrate 14.

The integrated circuit 12 typically has a coefficient of thermal expansion that is different than the thermal coefficient of the substrate 14. The integrated circuit 12 will therefore expand at a different rate than the substrate 14 when the package 10 is thermally cycled. The unattached area 34 allows the integrated circuit 12 to float relative to the substrate 14 during a change in the temperature of the package 10. The float reduces the thermally induced stresses on the die solder bumps 22 caused by the differential thermal coefficient of expansion of the die 12 and substrate 14.

The unattached area 34 may be created by inserting a shim 36 during the assembly process of the substrate 14. The shim 36 may be constructed from a material such as TEFLON® that will not become attached to the functional adhesive that is typically used to create the substrate 14. Alternatively, a chemical composition can be inserted into the area 34, during the assembly process, which reduces the bonding qualities of the adhesive so that the first layer 30 is not attached to the second layer 32 in the areas where the chemical is applied. Other processes or techniques may be employed to create a void or otherwise interrupt the bonding of the layers in the unattached area 34.

Figure 5:
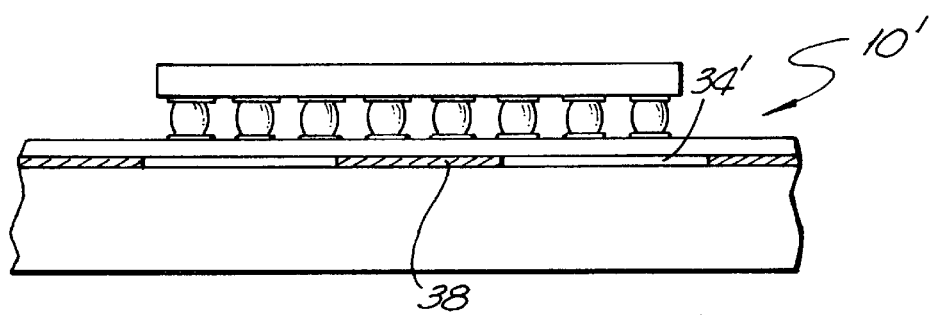
FIG. 5 is a side cross-sectional view of an alternate embodiment of the package.
Figure 6:
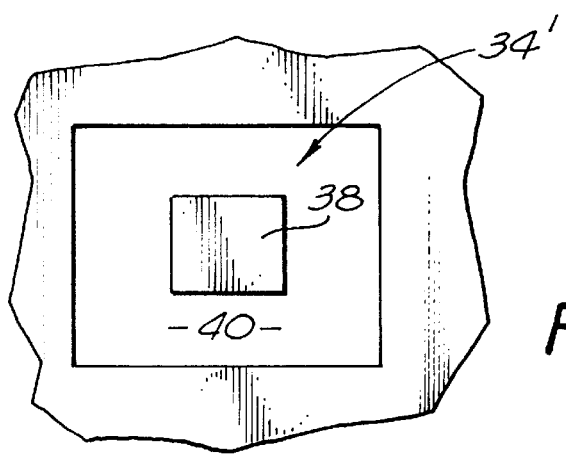
FIG. 6 is a top cross-sectional view of the package of FIG. 5.

FIGS. 5 and 6 show an alternate embodiment of a package 10' which has a window frame shaped unattached area 34'. The window frame area 34' is attached in a center portion 38 and unattached in an outer portion 40. The center portion 38 can be attached because minimal thermal expansion occurs at the center of the integrated circuit 12 and the substrate 14.

Figure 7A:
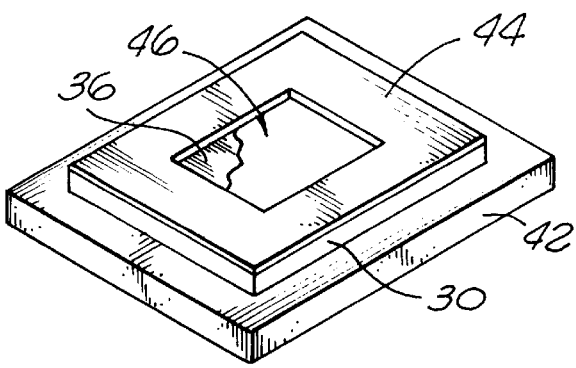
FIGS. 7a–b show a method for constructing a substrate of the integrated circuit package.
Figure 7B:
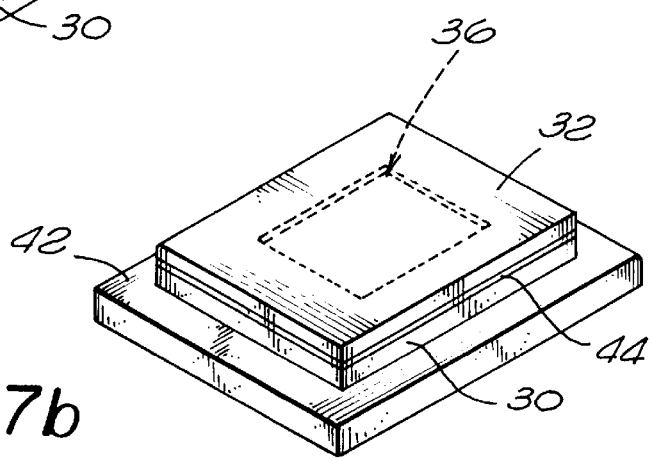

FIGS. 7a and 7b show a method for constructing the substrate 14. The first layer 30 is provided on a tooling plate 42. The first layer 30 is typically a sheet of dielectric that has copper pads and traces etched onto one or both outer surfaces of the sheet. The etched copper may include the bond pads 16. A layer of adhesive 44 is then placed onto the first layer 30. The adhesive 44 is typically provided as a sheet that is cured under heat and temperature as is known in the art. A window 46 may be cut into the sheet 44 to create the unattached area of the substrate. The shim 36 may be placed into the window 46 of the adhesive sheet 44.

As shown in FIG. 7b, the second layer 32 can be then placed onto the adhesive 44. The second layer 32 is also typically a sheet of dielectric with etched copper traces. Additional layers can also placed onto the second layer 32. The layers 30 and 32, adhesive 44 and tool 42 are typically placed in a vacuum bag and subjected to heat and pressure within an autoclave. The heat and pressure reflow the adhesive 44 so that the first layer 30 is attached to the second layer 32 to create the substrate 14. The shim 36 creates the unattached area 34.

The substrate 14 is removed from the autoclave. The integrated circuit 12 can be mounted to the substrate 14 by placing the die 12 onto the bond pads 16 and then reflowing the solder bumps 22. The integrated circuit 12 may be enclosed by an encapsulant (not shown) to protect the die 12. The finished package 10 can be subsequently mounted to the external printed circuit 28.

Although a flip chip is shown and described, it is to be understood that the present invention may be utilized in other integrated circuit package assemblies. For example, an unattached area 34 may be created in the external printed circuit board 28. The unattached area 34 will allow the entire package 10 to float relative to the printed circuit board 28.

What is claimed is:

1. A substrate for an integrated circuit package assembly, comprising:
    a substrate which has a plurality of bond pads, said substrate including a first layer that is attached to a second layer such that there is an area adjacent to said bond pads where said first layer is unattached to said second layer; and,
    a shim that is located in said unattached area.

2. The substrate as recited in claim 1, wherein said unattached area is a void.

3. The substrate as recited in claim 1, wherein said substrate is a printed circuit board.

4. The substrate as recited in claim 3, further comprising an integrated circuit package that is attached to said bond pads of said substrate.

5. An integrated circuit package, comprising:
    a substrate which has a plurality of bond pads, said substrate including a first layer that is attached to a second layer such that there is an area adjacent to said bond pads where said first layer is unattached to said second layer;
    a shim that is located in said unattached area; and,
    an integrated circuit that is mounted to said bond pads of said substrate.

6. The package as recited in claim 5, wherein said unattached area is a void.

7. The package as recited in claim 5, wherein said integrated circuit is mounted to said bonding pads with a plurality of solder bumps.

8. The package as recited in claim 5, wherein said substrate is a printed circuit board.

9. The package as recited in claim 5, further comprising an external printed circuit board that is attached to said substrate.

* * * * *